United States Patent
McCollum et al.

(10) Patent No.: US 11,395,428 B2
(45) Date of Patent: Jul. 19, 2022

(54) SIDE PANEL WITH CABLE DIVIDERS

(71) Applicant: Toshiba International Corporation, Houston, TX (US)

(72) Inventors: William McCollum, Houston, TX (US); Michael Alexander, Katy, TX (US)

(73) Assignee: TOSHIBA INTERNATIONAL CORPORATION, Houston, TX (US)

( * ) Notice: Subject to any disclaimer, the term of this patent is extended or adjusted under 35 U.S.C. 154(b) by 226 days.

(21) Appl. No.: 16/802,005

(22) Filed: Feb. 26, 2020

(65) Prior Publication Data

US 2021/0267082 A1   Aug. 26, 2021

(51) Int. Cl.
| | |
|---|---|
| *H05K 7/00* | (2006.01) |
| *H05K 7/02* | (2006.01) |
| *H02G 3/04* | (2006.01) |
| *H02G 3/22* | (2006.01) |

(52) U.S. Cl.
CPC ............ *H05K 7/02* (2013.01); *H02G 3/0456* (2013.01); *H02G 3/22* (2013.01)

(58) Field of Classification Search
CPC ........... H05K 7/02; H02G 3/0456; H02G 3/22
See application file for complete search history.

(56) References Cited

U.S. PATENT DOCUMENTS

| | | | |
|---|---|---|---|
| 6,791,841 B1* | 9/2004 | Tirrell | H05K 5/0247 361/724 |
| 2014/0008123 A1* | 1/2014 | Pawluk | H02G 3/0437 174/99 R |
| 2015/0219866 A1* | 8/2015 | Veatch | G02B 6/445 385/135 |
| 2015/0253529 A1* | 9/2015 | Lu | G02B 6/3897 385/135 |
| 2020/0313411 A1* | 10/2020 | Williams | H02G 3/32 |

* cited by examiner

*Primary Examiner* — Pete T Lee
(74) *Attorney, Agent, or Firm* — Baker Botts L.L.P.

(57) ABSTRACT

The present disclosure provides for a rotatable side panel of a cabinet. A side panel, comprises: a primary base; one or more cable dividers; a first flange; and a second flange; wherein the one or more cable dividers are disposed on the primary base, wherein the one or more cable dividers are perpendicular to the primary base, wherein the first flange is disposed along one of the one or more cable dividers disposed furthest to one side of the primary base, wherein the second flange is disposed along one of the one or more cable dividers disposed furthest to the opposite side of the primary base from the first flange.

20 Claims, 4 Drawing Sheets

SIDE PANEL WITH CABLE DIVIDERS

TECHNICAL FIELD

Embodiments of the present disclosure relate to battery cabinets and other power or electronic apparatuses comprising a side panel configured to rotate to an open position to access an interior space.

BACKGROUND

In current arrangements, side parts are added to a cabinet or enclosure to provide for ease of cabling or wiring between other cabinets. Further, there often is not separation between the specific cabling or wiring (for example, between power and control cables). It would be beneficial to incorporate a component as a part of the cabinet or enclosure to reduce the amount of time it takes to couple cabinets together with cabling or wiring and to reduce the number of side parts added to the cabinet or enclosure.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business-related constraints, which will vary from one implementation to another. Moreover, it will be appreciated that such a development effort might be complex and time consuming but would nevertheless be a routine undertaking for those of ordinary skill in the art having the benefit of the present disclosure. Furthermore, in no way should the following examples be read to limit, or define, the scope of the disclosure.

Figure 1:
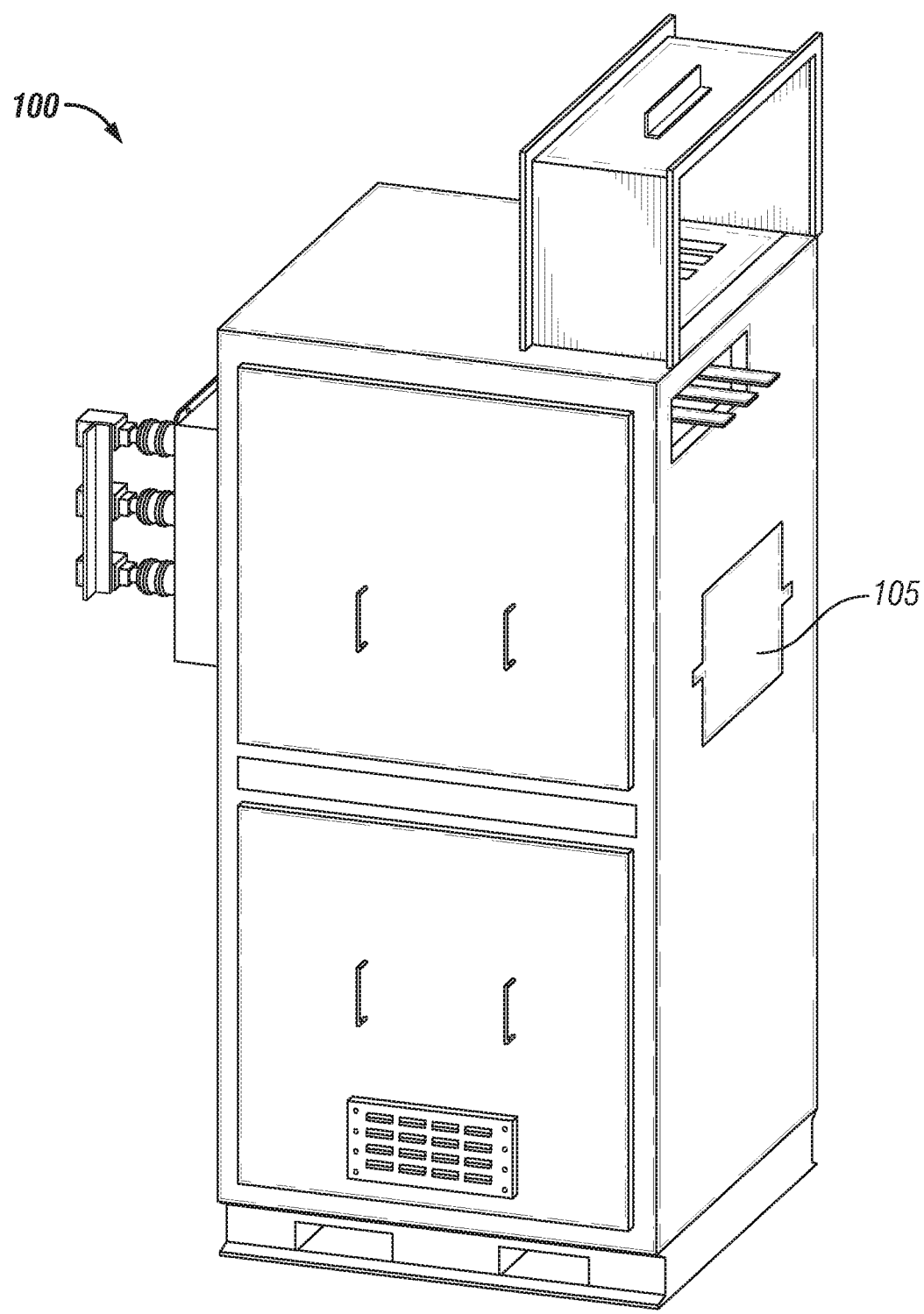
FIG. 1 illustrates a cabinet with a side panel, in accordance with an embodiment of the present disclosure.

FIG. 1 illustrates an isometric view of a cabinet 100. In embodiments, the cabinet 100 may be configured to house or contain any suitable electrical equipment, cables, wiring, and the like. In one or more embodiments, the cabinet 100 may be any suitable size, height, shape, and combinations thereof. The cabinet 100 may comprise of any suitable materials. Without limitations, the cabinet 100 may comprise of metals, nonmetals, polymers, composites, and combinations thereof. As illustrated, the cabinet 100 may comprise a side panel 105. The side panel 105 may be disposed about any suitable location on the cabinet 100. As shown, the side panel 105 may be disposed on a side of the cabinet 100. In embodiments, the side panel 105 may be configured to provide for access to an interior of the cabinet 100 while keeping any suitable related cabling separate from each other. While FIG. 1 illustrates a cabinet 100 utilizing the side panel 105, one of ordinary skill in the art would be able to incorporate the side panel 105 with any other suitable container or modular unit.

Figure 2:
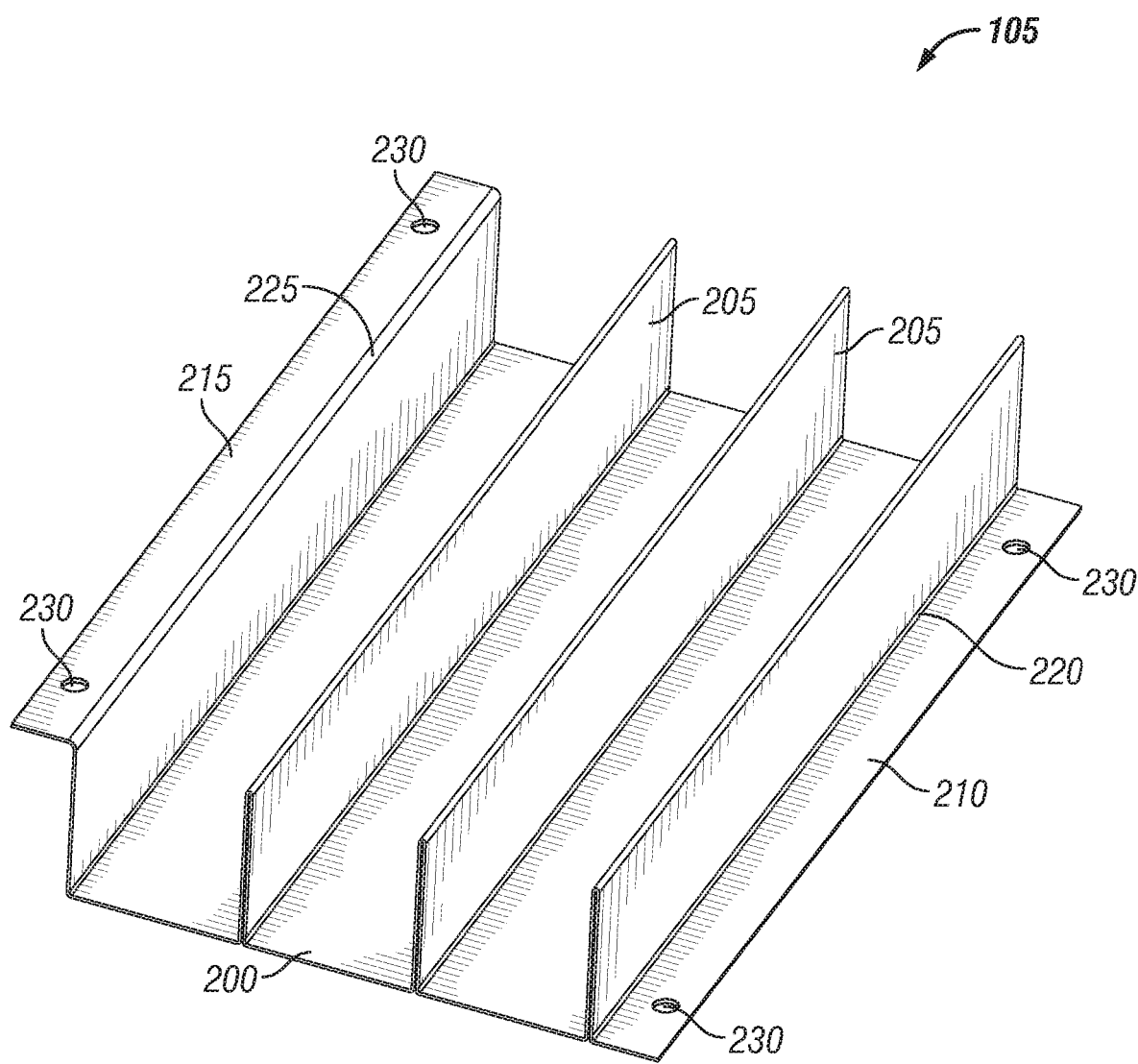
FIG. 2 illustrates an isometric view of the side panel, in accordance with an embodiment of the present disclosure.

FIG. 2 illustrates an isometric view of the side panel 105. In one or more embodiments, the side panel 105 may be any suitable size, height, shape, and combinations thereof. The side panel 105 may comprise of any suitable materials. Without limitations, the side panel 105 may comprise of metals, nonmetals, polymers, composites, and combinations thereof. The side panel 105 may comprise of a primary base 200, one or more cable dividers 205, a first flange 210, and a second flange 215. Without limitations, the primary base 200 may have a rectangular cross-sectional shape. In one or more embodiments, the primary base 200 may be any other suitable shape besides rectangular. In embodiments, the primary base 200 may serve to physically support a cable disposed within the side panel 105. As illustrated, the one or more cable dividers 205 may be disposed on the primary base 200. The one or more cable dividers 205 may extend vertically from and be perpendicular to the primary base 200. In embodiments, the one or more cable dividers 205 may each comprise equivalent dimensions in relation to each other. In other embodiments, there may be variance between the dimensions of each of the one or more cable dividers 205. In one or more embodiments, the distance between each of the one or more cable dividers 205 may be equivalent or similar to each other with a pre-determined tolerance (for example, 5%). In other embodiments, the distance between each of the one or more cable dividers 205 may be different. As illustrated, the one or more cable dividers 205 may have the same length as the primary panel 200 and may each run parallel to each other. Without limitations, the primary base 200 and the one or more cable dividers 205 may be a singular piece of material having undergone a metal forming process. In other embodiments, the one or more cable dividers 205 may be disposed upon the primary base 200 by coupling each other using any suitable means, including welding, brazing, adhesives, metal forming, fasteners, and any combinations thereof. In embodiments, there may be any suitable number of cable dividers 205 disposed on the primary base 200. Without limitations, there may be a number of one or more cable dividers 205 within a range of between 1 to 4, 1 to 10, 1 to 20, 1 to 40, etc.

As illustrated, the first flange 210 may be disposed along the one of the one or more cable dividers 205 furthest to one side of the side panel 105. In embodiments, the second flange 215 may be disposed along the one of the one or more cable dividers 205 furthest to the opposite side of the primary base 200 from the first flange 210. Both the first flange 210 and the second flange 215 may be disposed perpendicular to the one or more cable dividers 205 and parallel to the primary base 200. As illustrated, the first flange 210 may be disposed about a bottom end 220 of one of the one or more cable dividers 205 and along the same plane as the primary base 200. The second flange 215 may be disposed at a top end 225 of one of the one or more cable dividers 205. In other embodiments, the position of the first flange 210 may be that of the second flange 215, presently illustrated, and the position of the second flange 215 may be that of the first flange 210, presently illustrated. In embodiments, the first flange 210 and the second flange 215 may be configured to couple to an external component. Both the first flange 210 and the second flange 215 may comprise a plurality of holes 230 configured to receive fasteners.

Figure 3A:
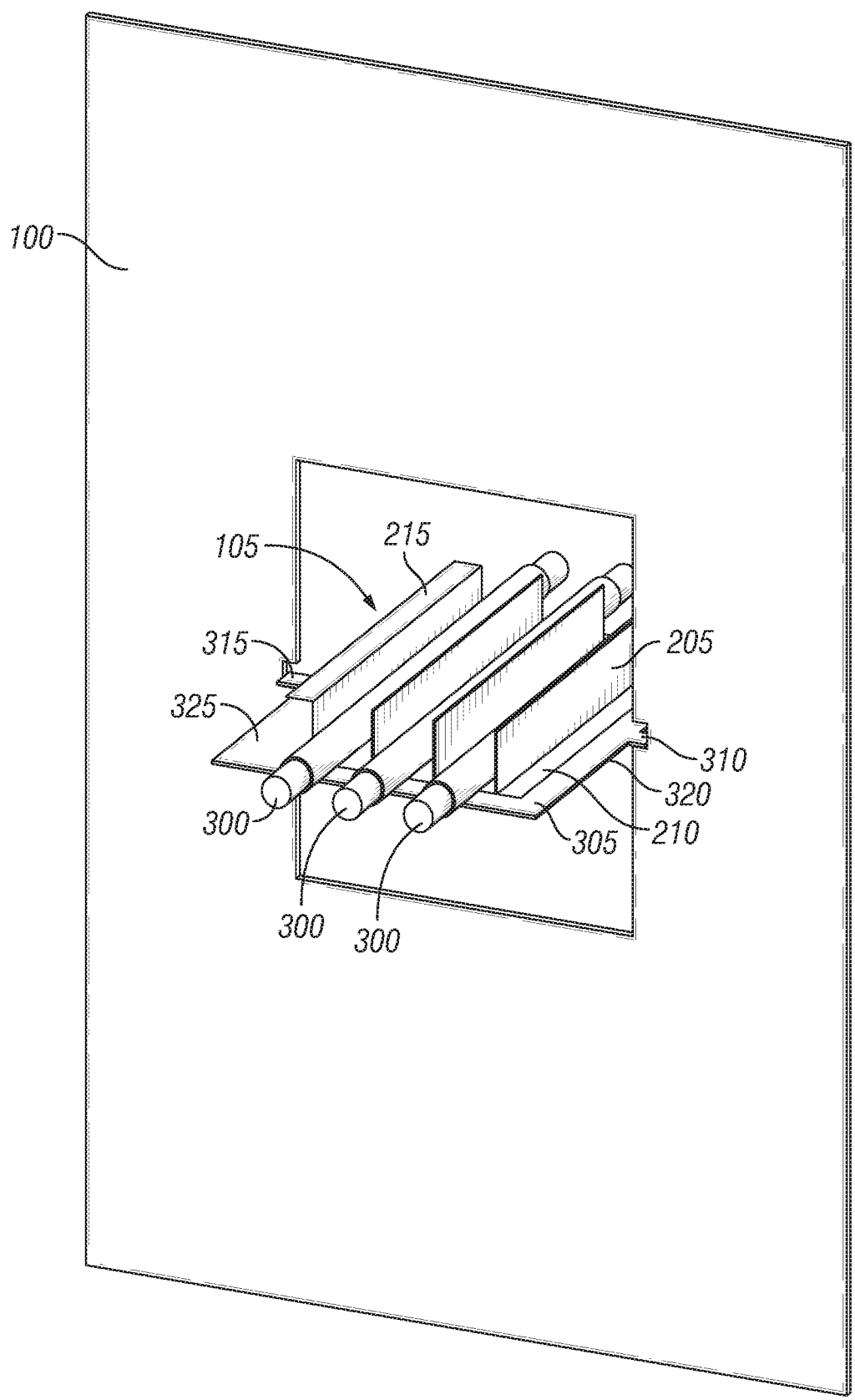
FIG. 3A illustrates the side panel in an open position, in accordance with an embodiment of the present disclosure.
Figure 3B:
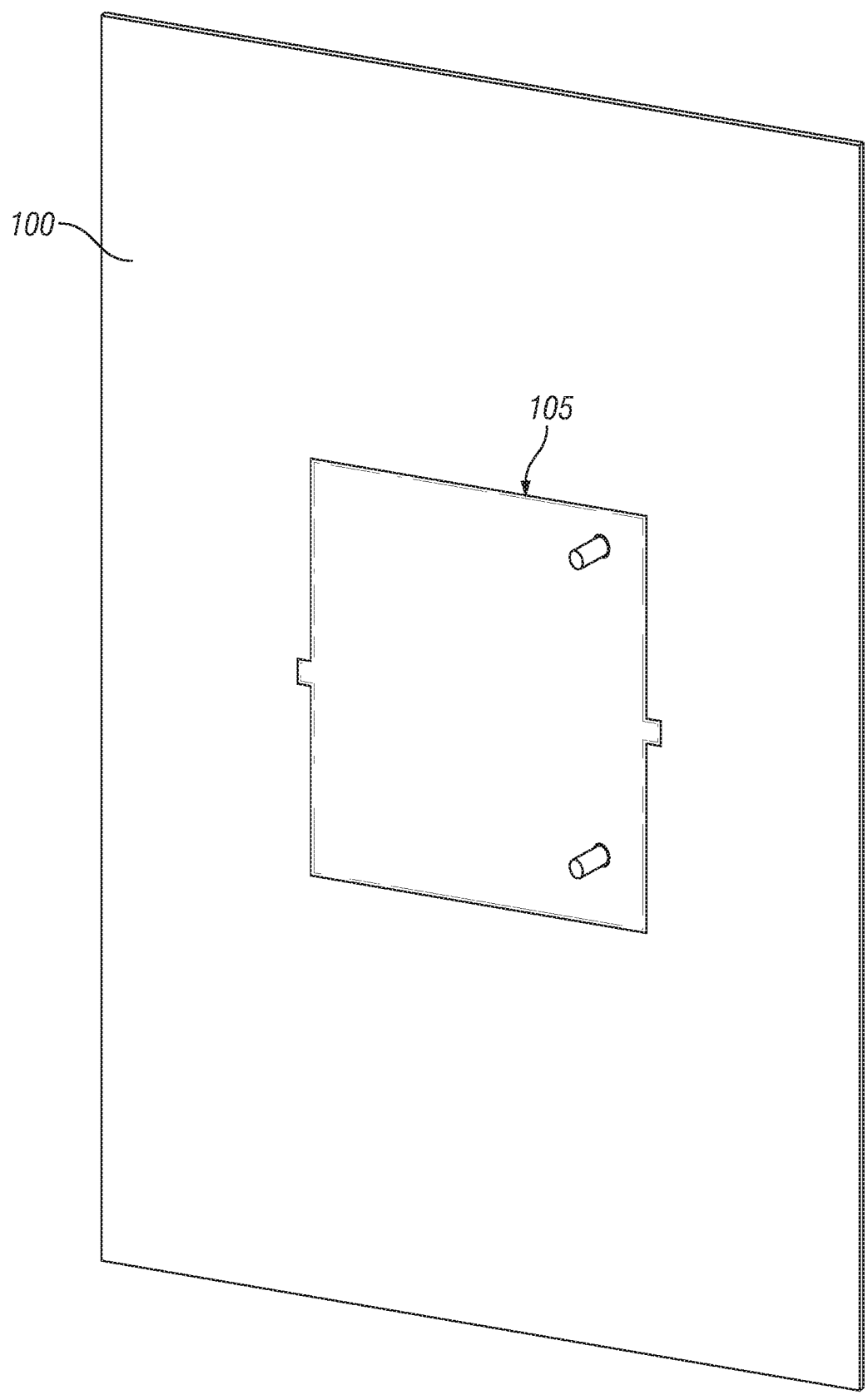
FIG. 3B illustrates the side panel in a closed position, in accordance with an embodiment of the present disclosure.

FIG. 3A illustrates a view of a side of the cabinet 100 with the side panel 105 in an open position. In the open position, the side panel 105 may have been actuated to be disposed perpendicular to the side of the cabinet 100. FIG. 3B illustrates a view of a side of the cabinet 100 with the side panel 105 in a closed position. In the closed position, the side panel 105 may be disposed parallel to and along the same plane as the side of the cabinet 100. With reference to FIG. 3A, there may be a plurality of cables 300 disposed in, within, or on the side panel 105. In one or more embodiments, the plurality of cables 300 may be originating from or terminating into the interior of the cabinet 100 and/or external to the cabinet 100. In embodiments, the side panel 105 may be compatible with any suitable number of cables 300. Without limitations, the side panel 105 may be capable of housing a plurality of cables 300 ranging from between about 1 to about 10, about 10 to about 25, about 25 to about 50, about 50 to about 150, and any combinations thereof.

In embodiments, the side panel 105 may comprise a secondary base 305. The secondary base 305 may be configured to allow the side panel 105 to rotate in relation to the cabinet 100. In one or more embodiments, the primary base 200 (referring to FIG. 2) may be coupled to the secondary base 305 via the first flange 210. There may be corresponding holes disposed through the secondary base 305 to mirror the locations of the plurality of holes 230 (referring to FIG. 2) of the first flange 210. In embodiments, there may be fasteners (for example, nuts, bolts, screws, pins, etc.) disposed through the holes of the secondary base 305 and the plurality of holes 230 of the first flange 210 to secure the primary base 200 to the secondary base 305. In certain embodiments, there may be a top structure (not shown) coupled to the side panel 105 via the second flange 215. In those embodiments, the top structure may be coupled to the side panel 105 in a similar manner as the secondary base 305 is coupled to the primary base 200. In those embodiments, the top structure may be disposed over the top ends 225 (referring to FIG. 2) of each of the one or more cable dividers 205 in order to enclose the plurality of cables 300.

As illustrated, the secondary base 305 may further comprise a first protrusion 310 and a second protrusion 315. The first protrusion 310 may be disposed at a first side 320 of the secondary base 305 extending away from the secondary base 305 a pre-determined length. The second protrusion 315 may be disposed at a second side 325 of the secondary base 305 extending away from the secondary base 305 a pre-determined length, wherein the first side 320 is opposite to the second side 325. In embodiments, the side panel 105 may be rotatable about the first protrusion 310 and the second protrusion 315. In one or more embodiments, the secondary base 305 may be coupled to the cabinet 100 using any suitable rotatable mechanism connected to the first protrusion 310 and the second protrusion 315.

With reference to FIGS. 3A-3B, the side panel 105 may provide for reduced time in coupling a plurality of neighboring cabinets 100 together. By actuating the side panel 105 to rotate about the secondary base 305, an operator may be able to connect cabling or wiring from a separate cabinet to the plurality of cables 300 within the cabinet 100 without having to modify the existing structure of the cabinet 100 with additional parts.

Although the disclosure and its advantages have been described in detail, it should be understood that various changes, substitutions and alterations can be made herein without departing from the spirit and scope of the disclosure as defined by the following claims.

What is claimed is:

1. A side panel, comprising:
    a primary base;
    one or more cable dividers disposed on the primary base and perpendicular to the primary base;
    a first flange disposed along one of the one or more cable dividers disposed furthest to one side of the primary base;
    a second flange disposed along one of the one or more cable dividers disposed furthest to the opposite side of the primary base from the first flange; and
    a first protrusion and a second protrusion both extending away from the one or more cable dividers in opposite directions, wherein the side panel is rotatable about the first protrusion and the second protrusion.

2. The side panel of claim 1, wherein a distance between each of the one or more cable dividers is equivalent.

3. The side panel of claim 1, wherein the one or more cable dividers have the same length as the primary panel and are parallel to each other.

4. The side panel of claim 1, wherein the one or more cable dividers each comprise equivalent dimensions in relation to each other.

5. The side panel of claim 1, wherein the first flange and the second flange are disposed perpendicular to the one or more cable dividers and parallel to the primary base.

6. The side panel of claim 1, wherein the first flange is disposed about a bottom end of the one of the one or more cable dividers and along the same plane as the primary base.

7. The side panel of claim 1, wherein the second flange is disposed at a top end of the one of the one or more cable dividers.

8. The side panel of claim 1, wherein the first flange and the second flange each comprise a plurality of holes.

9. The side panel of claim 1, further comprising a secondary base, wherein the primary base is coupled to the secondary base via the first flange.

10. The side panel of claim 9, wherein the secondary base further comprises the first protrusion and the second protrusion.

11. The side panel of claim 10, wherein the first protrusion is disposed at a first side of the secondary base, wherein the second protrusion is disposed at a second side of the secondary base.

12. The side panel of claim 1, wherein a top structure is coupled to the side panel via the second flange.

13. A cabinet, comprising:
    electrical equipment;
    a plurality of cables; and
    a side panel, wherein the side panel comprises:
        a primary base;
        one or more cable dividers disposed on the primary base and perpendicular to the primary base;
        a first flange disposed along one of the one or more cable dividers disposed furthest to one side of the primary base;
        a second flange disposed along one of the one or more cable dividers disposed furthest to the opposite side of the primary base from the first flange; and
        a first protrusion and a second protrusion both extending away from the one or more cable dividers in opposite directions, wherein the side panel is rotatable about the first protrusion and the second protrusion.

14. The cabinet of claim 13, wherein the one or more cable dividers each comprise equivalent dimensions in relation to each other, wherein the one or more cable dividers have the same length as the primary panel and are parallel to each other, wherein a distance between each of the one or more cable dividers is equivalent.

15. The cabinet of claim 13, wherein at least a portion of the plurality of cables are partially disposed within the side panel.

16. The cabinet of claim 15, wherein there is a single cable of the plurality of cables disposed between each set of one or more cable dividers.

17. The cabinet of claim 13, wherein the side panel further comprises a secondary base, wherein the primary base is coupled to the secondary base via the first flange.

18. The cabinet of claim 17, wherein the secondary base further comprises the first protrusion and the second protrusion, wherein the first protrusion is disposed at a first side of the secondary base, wherein the second protrusion is disposed at a second side of the secondary base.

19. The cabinet of claim 13, wherein a top structure is coupled to the side panel via the second flange.

20. The cabinet of claim 13, wherein the second flange is vertically offset by a distance from the first flange, and wherein the first flange and the second flange are disposed perpendicular to the one or more cable dividers and parallel to the primary base.

\* \* \* \* \*